United States Patent
Liou et al.

(10) Patent No.: US 8,347,487 B2
(45) Date of Patent: Jan. 8, 2013

(54) FABRICATING METHOD OF MAGNETORESISTANCE SENSOR

(75) Inventors: Fu-Tai Liou, Hsinchu County (TW); Chih-Chien Liang, Hsinchu County (TW); Chien-Min Lee, Hsinchu County (TW)

(73) Assignee: Voltafield Technology Corporation, Jhubei, Hsinchu County (TW)

( * ) Notice: Subject to any disclaimer, the term of this patent is extended or adjusted under 35 U.S.C. 154(b) by 1 day.

(21) Appl. No.: 13/174,758

(22) Filed: Jun. 30, 2011

(65) Prior Publication Data

US 2012/0222291 A1 Sep. 6, 2012

(30) Foreign Application Priority Data

Mar. 3, 2011 (TW) .............. 100107197 A

(51) Int. Cl.
*G11B 5/127* (2006.01)
*H04R 31/00* (2006.01)

(52) U.S. Cl. .............. 29/603.13; 29/603.12; 29/603.14; 29/603.15; 29/603.16; 29/603.18; 360/324.1; 360/324.12; 360/324.2; 428/611; 428/635; 428/674; 438/3; 438/57; 438/106; 438/127; 438/238

(58) Field of Classification Search .............. 29/603.07, 29/603.13–603.16, 603.18; 216/62, 65, 66; 360/324.1, 324.2, 324.11, 324.12; 428/611, 428/635, 674, 675; 438/3, 57, 106, 127, 238, 381

See application file for complete search history.

(56) References Cited

U.S. PATENT DOCUMENTS

| | | | | |
|---|---|---|---|---|
| 5,569,544 | A * | 10/1996 | Daughton | 428/811.3 |
| 5,617,071 | A * | 4/1997 | Daughton | 338/32 R |
| 6,300,617 | B1 * | 10/2001 | Daughton et al. | 250/214.1 |
| 6,734,671 | B2 * | 5/2004 | Murata et al. | 324/252 |
| 6,916,668 | B2 * | 7/2005 | Spielberger et al. | 438/3 |

* cited by examiner

*Primary Examiner* — Paul D Kim
(74) *Attorney, Agent, or Firm* — Cheng-Ju Chiang

(57) ABSTRACT

A fabricating method of a magnetoresistance sensor is provided with cost effective and process flexibility features. Firstly, a substrate is provided. Then, at least one magnetoresistance structure and at least one bonding pad are formed over the substrate, wherein the bonding pad is electrically connected with the magnetoresistance structure. Then, a passivation layer is formed over the magnetoresistance structure and the bonding pad. Then, a magnetic shielding and concentrator structure is formed over the passivation layer at a location corresponding to the magnetoresistance structure. Finally, bonding pad openings is formed on the passivation layer by patterned polyimide, thereby exposing the bonding pad. After bonding pad was opened, the patterned polyimide can be removed or retained as an additional protection layer.

10 Claims, 5 Drawing Sheets

FABRICATING METHOD OF MAGNETORESISTANCE SENSOR

FIELD OF THE INVENTION

The present invention relates to a fabricating process of a magnetic sensor, and particularly to a fabricating method of a magnetoresistance sensor.

BACKGROUND OF THE INVENTION

With the development of consumer electronic products such as mobile phones and electronic compasses, additionally together with conventional products such as motors and brakes, the demand of magnetoresistance sensors is progressively increasing.

FIGS. 1A through 1C are schematic cross-sectional views illustrating a fabricating process of a magnetoresistance sensor according to the prior art. The conventional fabricating process of the magnetoresistance sensor 100 comprises the following steps. Firstly, as shown in FIG. 1A, a semiconductor front-end process is performed to form a metal interconnection layer 106 having a bonding pad 106a on a substrate 101. Then, at least one magnetoresistance structure 102 is formed on the metal interconnection layer 106 and electrically connected with the metal interconnection layer 106. Then, a passivation layer 103 is formed on the magnetoresistance structure 102 and the metal interconnection layer 106.

Then, a bonding pad opening 104 is formed in the passivation layer 103 to expose the bonding pad 106a (see FIG. 1B) so as to facilitate carrying out the subsequent wiring and packaging processes. Then, a patterned magnetic metal layer is formed on the passivation layer 103 and over the magnetoresistance structure 102, thereby defining a magnetic shielding and/or concentrator structure 105 (see FIG. 1C). The magnetic shielding and/or concentrator structure 105 is used for shielding external magnetic or electromagnetic field so as to reduce influence of the electromagnetic interference (EMI) on the magnetoresistance structure 102. Alternatively, the magnetic shielding and/or concentrator structure 105 may strengthen the influence of the external magnetic field on the magnetoresistance structure 102.

However, during the process of forming the shielding and/or concentrator structure 105, the bonding pad 106a is readily damaged, and thus the production yield of the magnetoresistance sensor 100 is impaired. For solving the above drawbacks, the process of fabricating the magnetoresistance sensor 100 will become more complicated, and thus the fabricating cost is increased.

Therefore, there is a need of providing a fabricating process of a magnetoresistance sensor in order to increase the production yield of the magnetoresistance sensor and reduce the fabricating cost.

SUMMARY OF THE INVENTION

The present invention provides a fabricating method of a magnetoresistance sensor in order to increase the production yield of the magnetoresistance sensor and reduce the fabricating cost.

The present invention provides a fabricating method of a magnetoresistance sensor. Firstly, a substrate is provided. Then, at least one magnetoresistance structure and at least one bonding pad are formed over the substrate, wherein the bonding pad is electrically connected with the magnetoresistance structure. Then, a passivation layer is formed over the magnetoresistance structure and the bonding pad. Then, a magnetic shielding and/or concentrator structure is formed over the passivation layer at a location corresponding to the magnetoresistance structure. Afterwards, a bonding pad opening is formed in the passivation layer, thereby exposing the bonding pad.

In an embodiment, the magnetoresistance structure is an anisotropic magnetoresistance (AMR) structure, a giant magnetoresistance (GMR) structure, a tunneling magnetoresistance (TMR) structure, a colossal magnetoresistance (CMR) structure, or a combination thereof.

In an embodiment, the magnetoresistance structure is made of ferromagnetic material, antiferromagnetic material, non-ferromagnetic metallic material, tunneling oxide, or a combination thereof.

In an embodiment, the passivation layer is multi-layered structure including a silicon dioxide ($SiO_2$) layer and a silicon nitride (SiN) layer, and the passivation layer is produced by a low-temperature deposition process.

In an embodiment, the step of forming the magnetic shielding and/or concentrator structure includes sub-steps of forming a seeding layer on the passivation layer, forming a patterned photoresist layer on the seeding layer, and forming a magnetic metal layer on the seeding layer by using the patterned photoresist layer as a mask. Various magnetic materials and thickness can be adapted to this process with less harmful to bonding pad and do not need to develop new process conditions.

In an embodiment, the step of forming the bonding pad opening includes sub-steps of forming a polymeric mask layer over the passivation layer and the magnetic shielding and/or concentrator structure, patterning the polymeric mask layer, and removing the passivation layer overlying the bonding pad, thereby exposing the bonding pad.

In an embodiment, the polymeric mask layer is made of polyimide (PI).

In an embodiment, after the bonding pad opening is formed, the patterned polymeric mask layer can be optionally removed or retained as an additional protection layer.

In an embodiment, the magnetic shielding and/or concentrator structure is made of ferromagnetic material, wherein the ferromagnetic material is nickel, iron, cobalt, Mu metal, the arbitrary combination thereof or the alloy having one of the elements including nickel (Ni), iron (Fe) and cobalt (Co).

In an embodiment, the substrate is a semiconductor substrate made of silicon (Si), silicon covered by a dielectric material, silicon germanium (SiGe), gallium arsenide (GaAs), silicon carbide (SiC), or a combination thereof, or the substrate is an application-specific integrated circuit (ASIC), Si chip with logic/analog/mixed-mode etc circuits or a printed circuit board (PCB).

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed. In the descriptions and drawings, the elements with similar functions will be designated by similar numeral references.

The present invention provides a fabricating method of a magnetoresistance sensor in order to increase the production yield of the magnetoresistance sensor and reduce the fabricating cost.

Figure 1A:
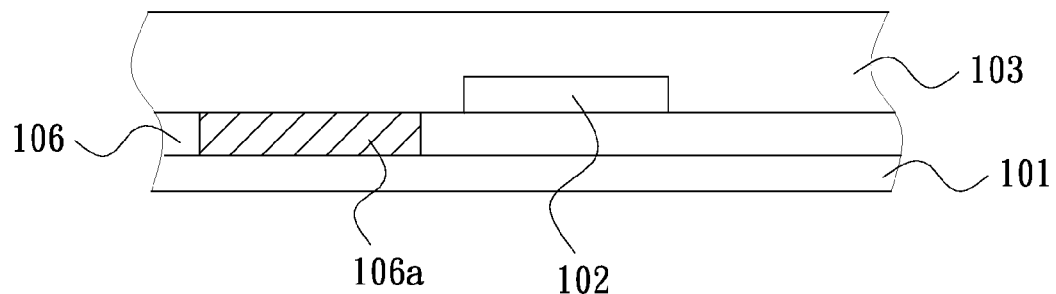
FIGS. 1A through 1C are schematic cross-sectional views illustrating a fabricating process of a magnetoresistance sensor according to the prior art.
Figure 1B:
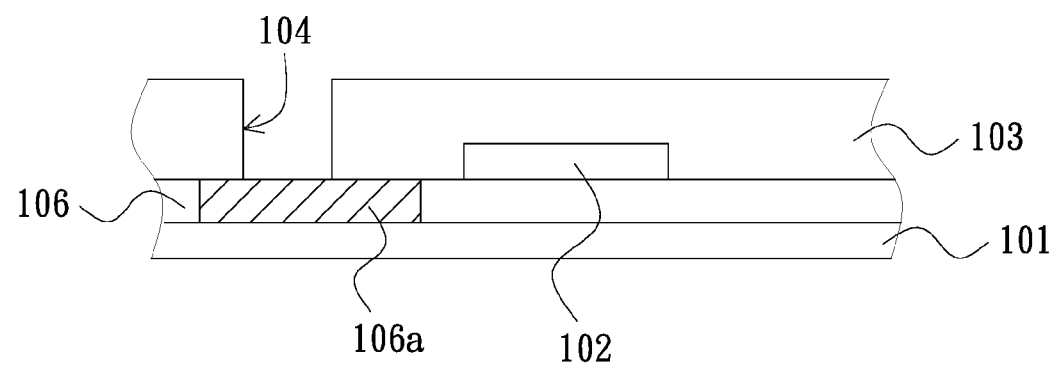
Figure 1C:
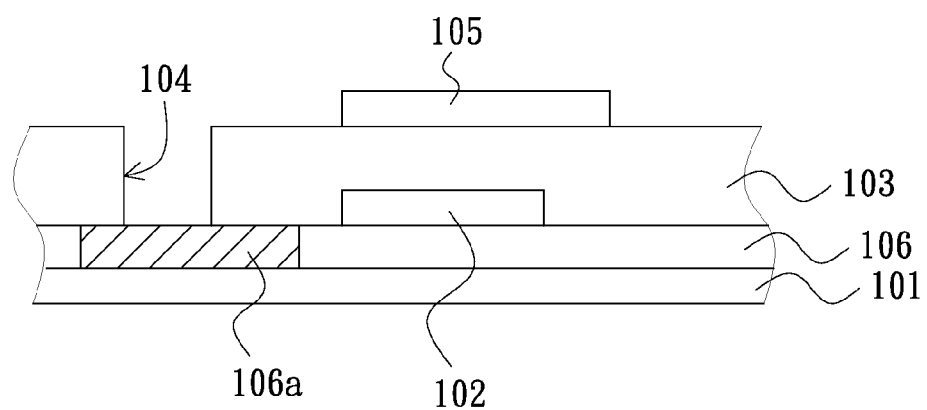
Figure 2A:
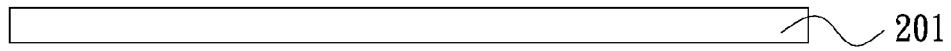
FIGS. 2A through 2G are schematic cross-sectional views illustrating a fabricating method of a magnetoresistance sensor according to an embodiment of the present invention.

FIGS. 2A through 2G are schematic cross-sectional views illustrating a fabricating method of a magnetoresistance sensor according to an embodiment of the present invention. The fabricating method of the magnetoresistance sensor 200 comprises the following steps. Firstly, as shown in FIG. 2A, a substrate 201 is provided. Since the fabricating method of the magnetoresistance sensor 200 is a wafer-scale process, the substrate 201 is a semiconductor substrate made of silicon (Si), Si covered by a dielectric material, silicon germanium (SiGe), gallium arsenide (GaAs), silicon carbide (SiC), or a combination thereof. Alternatively, the substrate 201 is a silicon chip with front-end logic/analog/mixed-mode etc circuits. For example, the substrate 201 is an application-specific integrated circuit (ASIC) or a printed circuit board (PCB). In this embodiment, the substrate 201 is illustrated by referring to a silicon substrate.

Figure 2B:
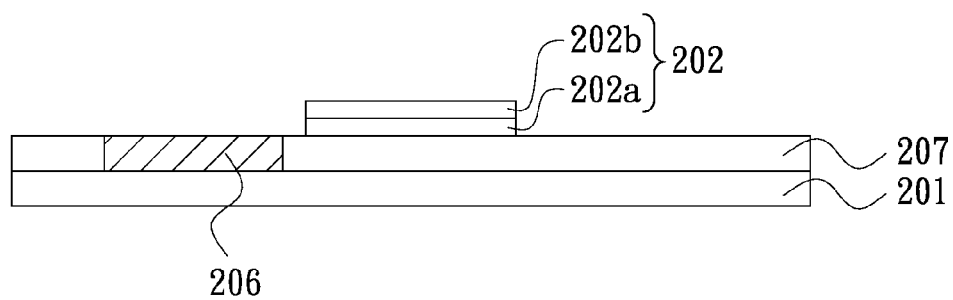

Then, as shown in FIG. 2B, a front-end process is performed to form at least one metal interconnection layer 207 having at least one bonding pad 206 on the substrate 201. Then, at least one magnetoresistance structure 202 is formed on the metal interconnection layer 207 and electrically connected with the metal interconnection layer 207.

For example, the metal interconnection layer 207 is made of tungsten, aluminum or copper. Each magnetoresistance structure 202 comprises at least one magnetoresistance layer 202a and at least one hard mask layer 202b. Generally, the magnetoresistance layer 202a is an anisotropic magnetoresistance (AMR) device, a giant magnetoresistance (GMR) device, a tunneling magnetoresistance (TMR) device, a colossal magnetoresistance (CMR) device, or a combination thereof. Moreover, the magnetoresistance layer 202a is made of, but not limited to, ferromagnetic material, antiferromagnetic material, non-ferromagnetic metallic material, tunneling oxide, or a combination thereof.

Figure 2C:
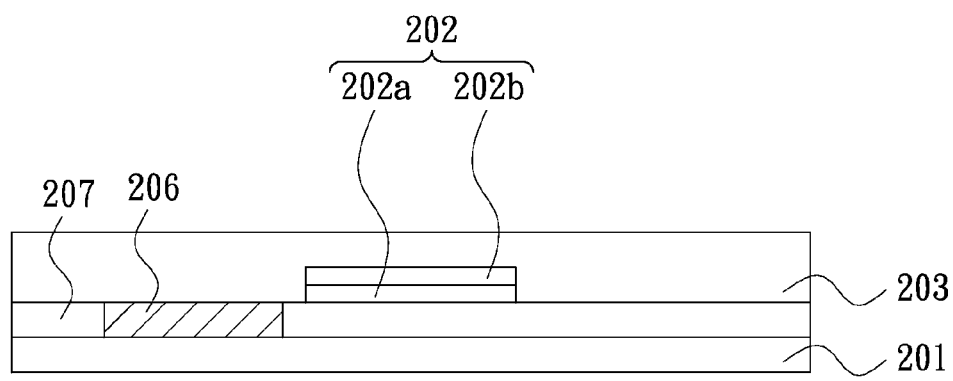

Then, as shown in FIG. 2C, a passivation layer 203 is formed on the magnetoresistance structure 202 and the bonding pad 206 for protecting the magnetoresistance structure 202. In this embodiment, the passivation layer 203 is multi-layered structure including a silicon dioxide ($SiO_2$) layer and a silicon nitride (SiN) layer. Moreover, the passivation layer 203 is produced by a low-temperature deposition process.

Figure 2D:
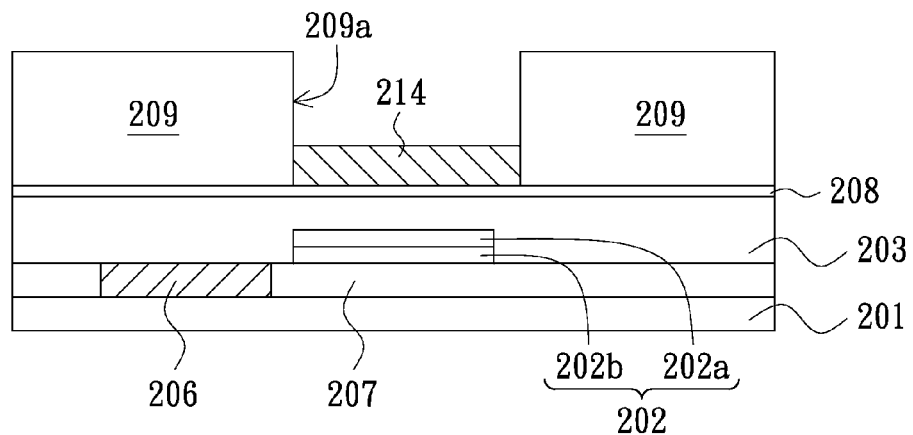
Figure 2E:
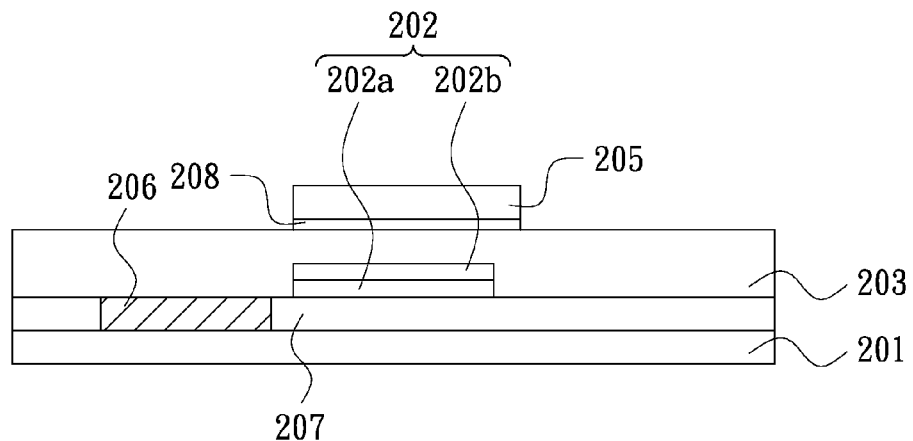

Then, a magnetic shielding and/or concentrator structure 205 is formed on the passivation layer 203 at a location corresponding to the magnetoresistance structure 202. Hereinafter, the step of forming the magnetic shielding and/or concentrator structure 205 will be illustrated with reference to FIGS. 2D and 2E. As shown in FIG. 2D, a seeding layer 208 is formed first on the passivation layer 203, and a patterned photoresist layer 209 is then formed on the seeding layer 208. The patterned photoresist layer 209 has an opening 209a, which is aligned with the magnetoresistance structure 202 or staggered with the magnetoresistance structure 202. Moreover, the seeding layer 208 is partially exposed to the opening 209a. By using the patterned photoresist layer 209 as a mask, an electroplating process is performed to electroplate a magnetic material 214 on the exposed seeding layer 208 through the opening 209a, so that a magnetic metal layer is formed on the seeding layer 208. After the patterned photoresist layer 209 and a portion of the seeding layer 208 are removed, the magnetic shielding and/or concentrator structure 205 is formed (see FIG. 2E).

In some embodiments, the magnetic shielding and/or concentrator structure 205 is aligned with the center of the magnetoresistance structure 202. In addition, the size of the magnetic shielding and/or concentrator structure 205 is larger than the size of the magnetoresistance structure 202. The magnetic shielding and/or concentrator structure 205 is used for shielding external magnetic or electromagnetic field, thereby reducing the influence of the electromagnetic interference (EMI) on the magnetoresistance structure 202. In some embodiments, the magnetic shielding and/or concentrator structure 205 is not aligned with the magnetoresistance structure 202. Under this circumstance, the magnetic shielding and/or concentrator structure 205 can strengthen the influence of the external magnetic field on the magnetoresistance structure 202. In this embodiment, the magnetic shielding and/or concentrating structure 205 is made of ferromagnetic material. The ferromagnetic material is, but not limited to, nickel, iron, cobalt, Mu metal or a combination thereof.

Figure 2F:
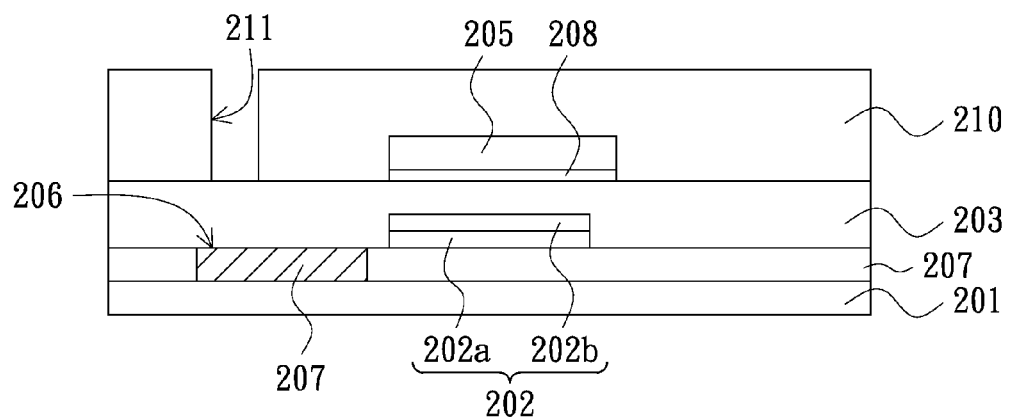
Figure 2G:
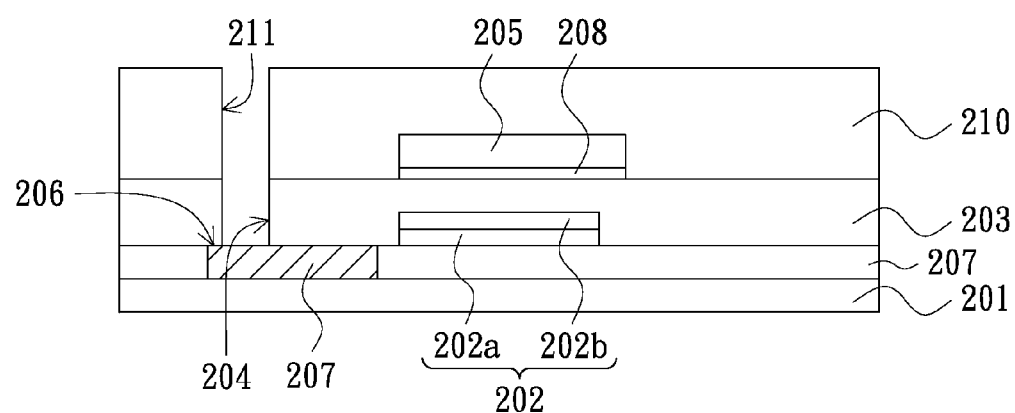

Then, a bonding pad opening 204 is formed through the passivation layer 203, thereby exposing the bonding pad 206. In an embodiment, the step of forming the bonding pad opening 204 will be illustrated with reference to FIGS. 2F and 2G. As shown in FIG. 2F, a patterned polymeric mask layer 210 is formed over the passivation layer 203 and the magnetic shielding and/or concentrator structure 205, and then an opening 211 is formed in the patterned polymeric mask layer 210 at a location corresponding to the bonding pad 206 by an exposure and development step. In an embodiment, the polymeric mask layer 210 is made of polyimide (PI).

Then, by using the patterned polymeric mask layer 210 as a mask, a portion of the passivation layer 203 overlying the bonding pad 206 is removed, so that a bonding pad opening 204 is formed through the passivation layer 203. Through the bonding pad opening 204 and the opening 211, the bonding pad 206 is exposed (see FIG. 2G). Meanwhile, the magnetoresistance sensor 200 is produced.

After the bonding pad opening 204 is formed, a photoresist stripping process is optionally performed to remove the patterned polymeric mask layer 210. Alternatively, the patterned polymeric mask layer 210 may be retained to be used as an additional protection layer for protecting the magnetic shielding and/or concentrator structure 205.

From the above description, the fabricating method of the magnetoresistance sensor according to the present invention is distinguished from the conventional fabricating process. In accordance with the fabricating method of the present invention, the step of forming the bonding pad opening is performed after the patterning of magnetic shielding and/or concentrator structure. Since the step of defining the magnetic shielding and/or concentrator structure is performed before the bonding pad opening is formed in the passivation layer, the possibility of damaging the bonding pad during the fabricating process will be minimized. It means no additional process is required to prevent bonding pad from damage by the metal deposition process (e.g. the electroplating process) and the patterning process (e.g. an etching process) when forming the magnetic shielding and/or concentrator structure. Moreover, the protection on bonding pad is still valid even if the materials or the thickness of the magnetic shielding and/or concentrator structure has been changed.

Moreover, since the polymeric mask layer for definition of the bonding pad opening may be retained as an additional protection layer for the magnetic shielding and/or concentrator structure. It is not necessary to remove the polymeric mask layer by an additional photoresist stripping process. As a consequence, the fabricating process is simplified and the fabricating cost is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabricating method of a magnetoresistance sensor, comprising steps of:
    providing a substrate;
    forming at least one magnetoresistance structure and at least one bonding pad over the substrate, wherein the bonding pad is electrically connected with the magnetoresistance structure;
    forming a passivation layer over the magnetoresistance structure and the bonding pad;
    forming a magnetic shielding and/or concentrator structure over the passivation layer at a location corresponding to the magnetoresistance structure; and
    forming a bonding pad opening through the passivation layer after the magnetic shielding and/or concentrator structure is formed, thereby exposing the bonding pad.

2. The fabricating method of the magnetoresistance sensor according to claim 1, wherein the magnetoresistance structure is an anisotropic magnetoresistance (AMR) structure, a giant magnetoresistance (GMR) structure, a tunneling magnetoresistance (TMR) structure, a colossal magnetoresistance (CMR) structure, or a combination thereof.

3. The fabricating method of the magnetoresistance sensor according to claim 1, wherein the magnetoresistance structure is made of ferromagnetic material, antiferromagnetic material, non-ferromagnetic metallic material, tunneling oxide, or a combination thereof.

4. The fabricating method of the magnetoresistance sensor according to claim 1, wherein the passivation layer is a multi-layered structure including a silicon dioxide ($SiO_2$) layer and a silicon nitride (SiN) layer, and the passivation layer is produced by a low-temperature deposition process.

5. The fabricating method of the magnetoresistance sensor according to claim 1, wherein the step of forming the magnetic shielding and/or concentrator structure comprises sub-steps of:
    forming a seeding layer on the passivation layer;
    forming a patterned photoresist layer on the seeding layer; and
    forming a magnetic metal layer on the seeding layer by using the patterned photoresist layer as a mask.

6. The fabricating method of the magnetoresistance sensor according to claim 1, wherein the step of forming the bonding pad opening comprises sub-steps of:
    forming a polymeric mask layer over the passivation layer and the magnetic shielding and/or concentrator structure;
    patterning the polymeric mask layer; and
    removing the passivation layer overlying the bonding pad, thereby exposing the bonding pad.

7. The fabricating method of the magnetoresistance sensor according to claim 6, wherein the polymeric mask layer is made of polyimide (PI).

8. The fabricating method of the magnetoresistance sensor according to claim 6, wherein after the bonding pad opening is formed, the patterned polymeric mask layer is removed or retained as an additional protection layer.

9. The fabricating method of the magnetoresistance sensor according to claim 1, wherein the magnetic shielding and/or concentrator structure is made of ferromagnetic material, wherein the ferromagnetic material comprises nickel, iron, cobalt, Mu metal or a combination thereof.

10. The fabricating method of the magnetoresistance sensor according to claim 1, wherein the substrate is a semiconductor substrate made of silicon (Si), Si covered by a dielectric material, silicon germanium (SiGe), gallium arsenide (GaAs), silicon carbide (SiC), or a combination thereof, or the substrate is an application-specific integrated circuit (ASIC), Si chip with logic/analog/mixed-mode etc circuits or a printed circuit board (PCB).

* * * * *